US012581658B2

(12) United States Patent
Yoon et al.

(10) Patent No.: US 12,581,658 B2
(45) Date of Patent: Mar. 17, 2026

(54) FERROELECTRIC MEMORY WITH MULTIPLE FERROELECTRIC LAYERS THROUGH A STACK OF GATE LINES

(71) Applicant: SK hynix Inc., Icheon-si (KR)

(72) Inventors: Sung Hyun Yoon, Icheon-si (KR); Dae Hyun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 369 days.

(21) Appl. No.: 17/710,564

(22) Filed: Mar. 31, 2022

(65) Prior Publication Data

US 2023/0120089 A1     Apr. 20, 2023

(30) Foreign Application Priority Data

Oct. 18, 2021     (KR) ........................ 10-2021-0138710

(51) Int. Cl.
| | |
|---|---|
| *H01L 27/115* | (2017.01) |
| *H01L 29/16* | (2006.01) |
| *H01L 29/51* | (2006.01) |
| *H01L 29/78* | (2006.01) |
| *H10B 51/20* | (2023.01) |
| *H10B 51/30* | (2023.01) |

(52) U.S. Cl.
CPC ............. *H10B 51/20* (2023.02); *H10B 51/30* (2023.02)

(58) Field of Classification Search
CPC ................................ H10B 51/20; H10B 51/30
See application file for complete search history.

(56) References Cited

U.S. PATENT DOCUMENTS

| | | |
|---|---|---|
| 7,098,496 B2 | 8/2006 | Li et al. |
| 10,211,223 B2 | 2/2019 | Houdt et al. |

| | | | |
|---|---|---|---|
| 2014/0355328 A1* | 12/2014 | Muller | ................ G11C 11/2275 257/295 |
| 2016/0118404 A1 | 4/2016 | Peng | |
| 2016/0181259 A1* | 6/2016 | Van Houdt | .......... H10D 64/689 257/295 |
| 2018/0233573 A1* | 8/2018 | Lin | ........................ H10B 53/00 |
| 2018/0269057 A1* | 9/2018 | Lei | ..................... H01L 21/02274 |
| 2019/0296122 A1* | 9/2019 | Ino | ........................ H10D 30/701 |
| 2019/0355584 A1* | 11/2019 | Yamaguchi | ......... G11C 11/2275 |
| 2020/0365618 A1* | 11/2020 | Zhang | ..................... H10B 51/20 |
| 2025/0169077 A1* | 5/2025 | Kim | ........................ H10B 51/10 |

FOREIGN PATENT DOCUMENTS

| | | | |
|---|---|---|---|
| JP | 2013048170 A | * | 3/2013 |
| KR | 1020190115508 A | | 10/2019 |
| KR | 102185788 B1 | | 12/2020 |

OTHER PUBLICATIONS

Claudia Richter et al., "Si doped hafnium oxide—A "fragile" ferroelectric system", Advanced Electronic Materials, Aug. 22, 2017.

* cited by examiner

*Primary Examiner* — Peter Bradford
(74) *Attorney, Agent, or Firm* — WILLIAM PARK AND ASSOCIATES LTD.

(57) ABSTRACT

A ferroelectric memory device includes interlayer insulating layers and gate lines alternately stacked, a data storage layer vertically passing through the interlayer insulating layers and the gate lines and having a cylindrical shape, and a channel layer formed in an area enclosed by the data storage layer. The data storage layer includes a first ferroelectric layer abutting on the channel layer, a second ferroelectric layer abutting on the interlayer insulating layers and the gate lines, and an interface layer formed between the first and the second ferroelectric layers.

18 Claims, 16 Drawing Sheets

FL
(R2)    ITL                    FL            31

GL

CHL

ISL

Z

X

FL
(R3)

FERROELECTRIC MEMORY WITH MULTIPLE FERROELECTRIC LAYERS THROUGH A STACK OF GATE LINES

CROSS-REFERENCE TO RELATED APPLICATION

The present application claims priority under 35 U.S.C. § 119(a) to Korean patent application number 10-2021-0138710, filed on Oct. 18, 2021, in the Korean Intellectual Property Office, the entire disclosure of which is incorporated herein by reference.

BACKGROUND

1. Technical Field

Various embodiments of the present disclosure generally relate to a ferroelectric memory device and a method of fabricating the ferroelectric memory device, and more particularly, to a ferroelectric memory device having improved retention characteristics, and a method of fabricating the ferroelectric memory device having improved retention characteristics.

2. Related Art

A memory device may be classified as a volatile memory device in which stored data is lost when power is lost, or a non-volatile memory device which can retain stored data even when power is lost.

Non-volatile memory devices may include NAND flash memory, NOR flash memory, resistive random access memory, phase-change memory, magnetoresistive random access memory, ferroelectric random access memory (or ferroelectric memory), spin transfer torque random access memory, etc.

A ferroelectric memory device including ferroelectric random access memory may use spontaneous polarization characteristics of ferroelectric material to store data. Therefore, the ferroelectric memory device may use a material having ferroelectric characteristics as a data storage layer. Electrical characteristics of the ferroelectric memory device may be changed depending on characteristics of the material that is used as the data storage layer.

SUMMARY

Some embodiments of the present disclosure are directed to a ferroelectric memory device having improved retention characteristics, and a method of fabricating the ferroelectric memory device.

A ferroelectric memory device in accordance with an embodiment of the present disclosure may include: interlayer insulating layers and gate lines alternately stacked; a data storage layer vertically passing through the interlayer insulating layers and the gate lines and having a cylindrical shape; and a channel layer formed in an area enclosed by the data storage layer. The data storage layer may include: a first ferroelectric layer abutting on the channel layer; a second ferroelectric layer abutting on the interlayer insulating layers and the gate lines; and an interface layer formed between the first and the second ferroelectric layers.

A ferroelectric memory device in accordance with an embodiment of the present disclosure may include: interlayer insulating layers and gate lines alternately stacked; a data storage layer vertically passing through the interlayer insulating layers and the gate lines and having a cylindrical shape; and a channel layer formed in an area enclosed by the data storage layer. The data storage layer may include: a first ferroelectric layer abutting on the channel layer; a second ferroelectric layer abutting on the interlayer insulating layers and the gate lines; a third ferroelectric layer formed between the first and the second ferroelectric layers; a first interface layer formed between the first and the third ferroelectric layers; and a second interface layer formed between the second and the third ferroelectric layers.

A method of fabricating a ferroelectric memory device in accordance with an embodiment of the present disclosure may include: forming a stack structure by alternately stacking interlayer insulating layers and gate lines; forming a vertical hole vertically passing through the stack structure; forming a data storage layer having a cylindrical shape by alternately forming a plurality of ferroelectric layers and a plurality of interface layers on an inner wall of the vertical hole; and forming a channel layer in an internal area of the data storage layer.

BRIEF DESCRIPTION OF THE DRAWINGS

FIGS. 4A to 4E are diagrams for describing various structures of the ferroelectric memory.

DETAILED DESCRIPTION

Specific structural or functional descriptions of embodiments introduced in this specification or application represent examples of the present disclosure. These descriptions should not be construed as being exhaustive or limiting possible embodiments of the specification or application.

Figure 1:
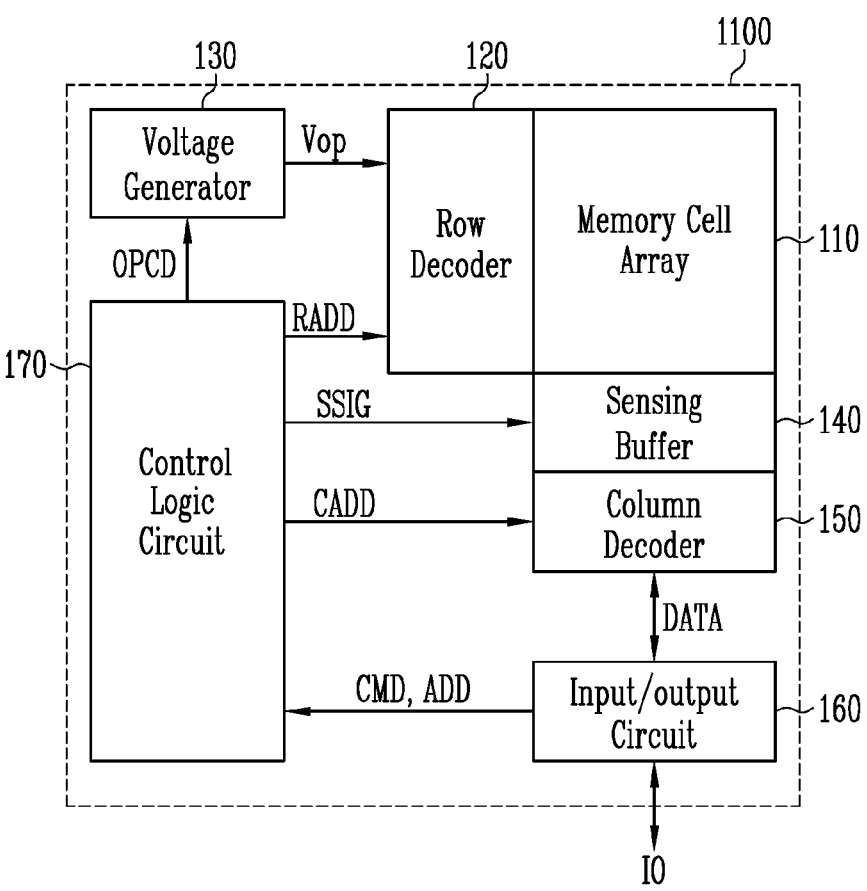
FIG. 1 is a diagram for describing a ferroelectric memory device in accordance with an embodiment of the present disclosure.

FIG. 1 is a diagram for describing a ferroelectric memory device 1100 in accordance with an embodiment of the present disclosure.

Referring to FIG. 1, the ferroelectric memory device 1100 may include a memory cell array 110 configured to store data, and peripheral circuits 120 to 170 configured to perform a program operation, a read operation, or an erase operation.

The memory cell array 110 may include a plurality of memory blocks each of which is configured to store data. Each of the memory blocks may include ferroelectric memory cells (or ferroelectric random access memory cells). The ferroelectric memory cells may be embodied in a three-dimensional structure in which the ferroelectric memory cells are vertically stacked on a substrate. The ferroelectric memory cells may store data using polarization which varies depending on a voltage applied to an electrode. The ferroelectric memory cells may retain stored data by spontaneous polarization characteristics even if the supply of power is interrupted.

The peripheral circuits 120 to 170 may include a row decoder 120, a voltage generator 130, a sensing buffer 140, a column decoder 150, an input/output circuit 160, and a control logic circuit 170.

The row decoder 120 may select one memory block from among the memory blocks included in the memory cell array 110 in response to a row address RADD, and transmit operating voltages Vop to the selected memory block.

The voltage generator 130 may generate and output operating voltages Vop needed to perform various operations, in response to an operation code OPCD.

The sensing buffer 140 may be connected to the memory cell array 110 by bit lines. For example, the sensing buffer 140 may include sensing circuits connected to the respective bit lines. The sensing circuits may simultaneously operate in response to sensing signals SSIG, and temporarily store data during a program operation or a read operation. The sensing circuits may sense voltages or currents of the bit lines that vary depending on threshold voltages of the memory cells, during a read operation or a verify operation.

The column decoder 150 may transmit data DATA between the input/output circuit 160 and the sensing buffer 140 in response to a column address CADD.

The input/output circuit 160 may be connected to an external device by input/output lines IO. For example, the external device may be a controller configured to transmit a command CMD, an address ADD, or data DATA to the ferroelectric memory device 1100. The input/output circuit 160 may input or output a command CMD, an address ADD, and data DATA through the input/output lines IO. For example, the input/output circuit 160 may transmit, to the control logic circuit 170, a command CMD and an address ADD received from the external device through the input/output lines IO, and transmit, to the column decoder 150, data DATA received from the external device through the input/output lines IO. The input/output circuit 160 may output the data DATA received from the column decoder 150 to the external device through the input/output lines IO.

The control logic circuit 170 may output an operation code OPCD, a row address RADD, sensing signals SSIG, and a column address CADD, in response to the command CMD and the address ADD. For example, the control logic circuit 170 may include software configured to perform an algorithm in response to the command CMD, and hardware configured to output an address ADD and various control signals.

Figure 2:
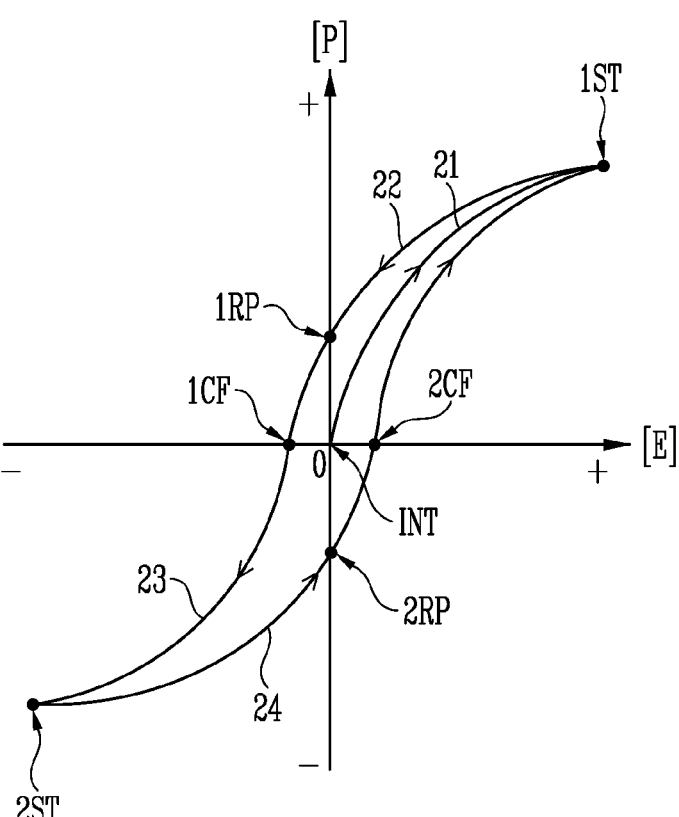
FIG. 2 is a diagram for describing a hysteresis curve of a ferroelectric memory.

FIG. 2 is a diagram for describing a hysteresis curve of the ferroelectric memory.

Referring to FIG. 2, hysteresis is a phenomenon in which, when material responds to an external stimulus, the material is influenced not only by the magnitude of the external stimulus but also by a present status of the material or a past external stimulus history. The hysteresis curve in the ferroelectric memory refers to a curve of a change in magnetization depending on the level of a voltage applied to an electrode, and may also be referred to as 'magnetic hysteresis curve'.

For example, in an initiation status INT in which no voltage is applied to the ferroelectric memory (E=0), the polarization P is zero. If a positive voltage is applied to the ferroelectric memory of which the polarization P is zero, the polarization P increases (see reference numeral 21) and enters a saturation status. In the present embodiment, the saturation status resulting from the positive voltage is defined as a first saturation status 1ST. If the supply of the voltage to the ferroelectric memory that is in the first saturation status 1ST is interrupted, the polarization P reduces. Here, the polarization P may maintain a specific value rather than returning to zero. The polarization P in the foregoing stage is referred to as remanent polarization. In the present embodiment, the remanent polarization that remains after the first saturation status 1ST is defined as a first remanent polarization 1RP.

If a negative voltage is applied to the ferroelectric memory that is in the status of the first remanent polarization 1RP, the polarization P reduces again. A voltage formed when the polarization P becomes zero is referred to as a coercive field CF. If a negative voltage lower than the coercive field CF is further applied to the ferroelectric memory, the polarization P further reduces (see reference numeral 23), so that the ferroelectric memory enters a second saturation status 2ST. Directions of cation and anion in the first saturation status 1ST and the second saturation status 2ST are opposite to each other. If the supply of the voltage to the ferroelectric memory that is in the second saturation status 2ST is interrupted, the polarization P increases again (see reference numeral 24), the polarization P of the ferroelectric memory may remain in a status of a second remanent polarization 2RP.

If a positive voltage is applied to the ferroelectric memory that is in the status of the second remanent polarization 2RP, the polarization P may increase again to the first saturation status 1ST.

In the above-described scheme, the polarization P of the ferroelectric memory may vary depending on a voltage applied to the electrode and remain in a constant level if no voltage is applied thereto. The ferroelectric memory may store data according to the foregoing characteristics of the polarization P.

Figure 3:
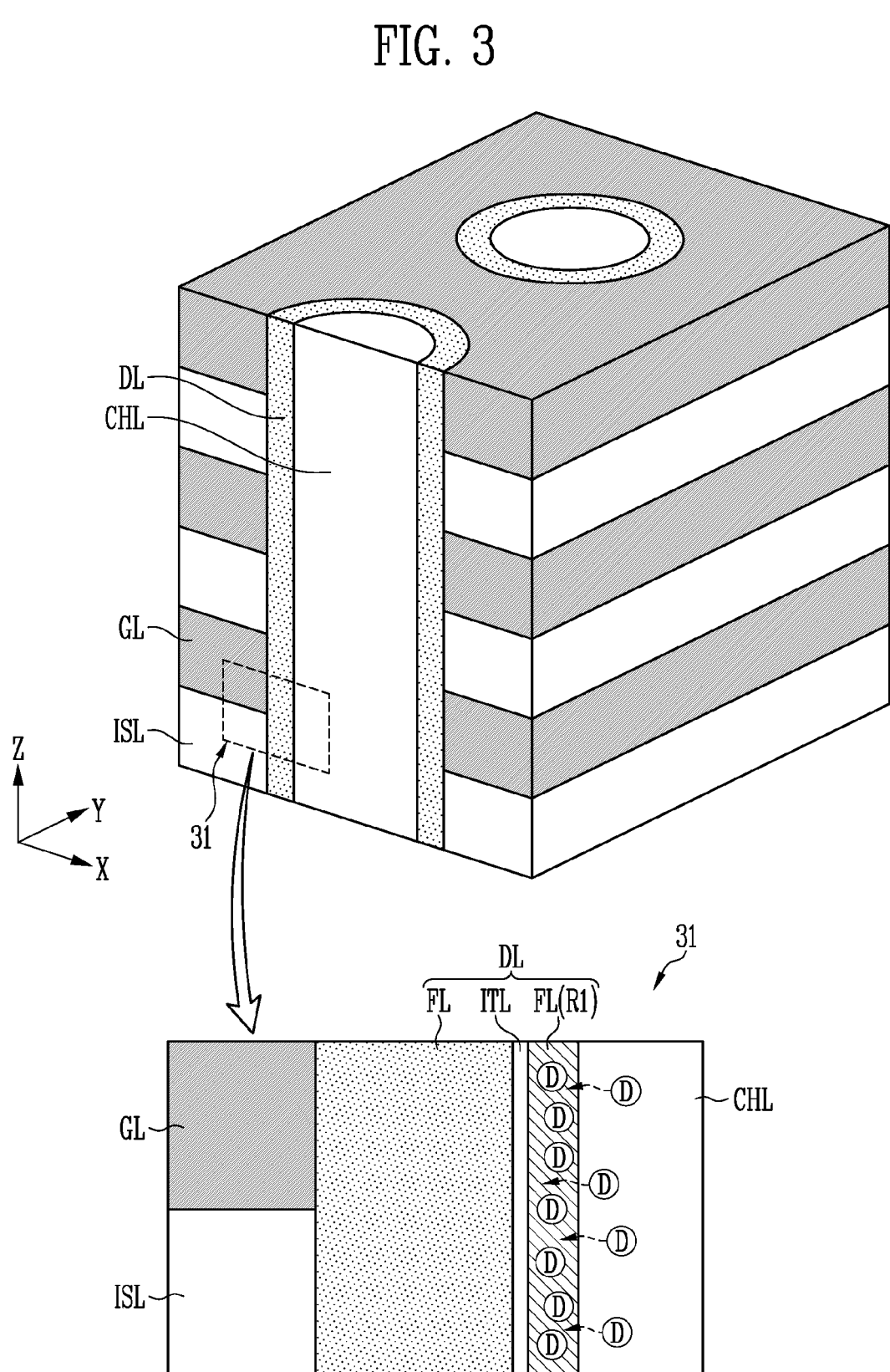
FIG. 3 is a diagram for describing a structure of the ferroelectric memory in accordance with an embodiment of the present disclosure.

FIG. 3 is a diagram for describing a structure of the ferroelectric memory in accordance with an embodiment of the present disclosure.

Referring to FIG. 3, the ferroelectric memory may include interlayer insulating layers ISL, gate lines GL, a data storage layer DL, and a channel layer CHL. The interlayer insulating layers ISL and the gate lines GL may be alternately stacked. The data storage layer DL and a channel layer CHL may be configured to vertically pass through the interlayer insulating layers ISL and the gate lines GL.

The interlayer insulating layers ISL may each be formed of an oxide layer or a silicon oxide layer. The gate lines GL may each be formed of a conductive layer or a metal layer. The interlayer insulating layers ISL may be configured to block electrical connection between the gate lines GL. The gate lines GL may be electrodes connected to the data storage layer DL and be used as word lines or selection lines. For example, the gate lines GL each may be formed of any one of tungsten (W), cobalt (Co), nickel (Ni), molybdenum (Mo), silicon (Si), and poly-silicon (poly-Si), or formed of a compound thereof.

The data storage layer DL may be formed in the shape of a cylinder vertically passing through the interlayer insulating layer ISL and the gate lines GL. The data storage layer DL in accordance with the present embodiment may include a plurality of ferroelectric layers FL, and at least one or more interface layers ITL. For example, the data storage layer DL may have a structure in which the interface layers ITL are formed between the ferroelectric layers FL. The data storage layer DL may have characteristics of the ferroelectric memory due to a combination of the ferroelectric layers FL and the interface layers ITL.

The ferroelectric layers FL may be electrically polarized by an external electric field, and be made of material which can maintain electrical polarization even when no external electric field is applied thereto. The words "maintaining electrical polarization" refer to that different polarities are maintained to store data. Hence, the data storage layer DL may store data 0 or data 1 by the polarization of the ferroelectric layers FL. The ferroelectric layers FL may be formed of at least one material of $PbZrTiO_3$ (PZT), $SrBizTa_2Og$ (STB), $BiFeO_3$ (BFO), $HfO_2$, $HfO_2ZrO_2$ (HZO), and $HfSiO_4$ (HSO). For example, the ferroelectric layers FL may each be formed of any one layer of the layers of above-mentioned material, or formed of a combination layer or stacked layer of the layers of above-mentioned material.

The interface layers ITL may be used to prevent migration or diffusion of dopant between the ferroelectric layers FL. In other words, because characteristics in which remanent polarization is maintained may be degraded if dopants are drawn into the ferroelectric layers FL, at least one or more interface layers ITL may be formed between the ferroelectric layers FL in the present embodiment, so that the data storage characteristics of the data storage layer DL can be improved. The interface layers ITL each may be formed of an insulating layer capable of mitigating diffusion of dopants. For example, the interface layers ITL may be formed of $SiO_2$.

The channel layer CHL may be formed in an internal area of the data storage layer DL. In other words, the data storage layer DL may be formed to enclose a sidewall of the channel layer CHL. The channel layer CHL may be formed of a conductive layer or a metal layer. For instance, the channel layer CHL may be formed of silicon or polysilicon. Although not illustrated in the drawing, a bit line or a source line may be connected to an upper portion and a lower portion of the channel layer CHL. For example, the bit line may be connected to the upper portion of the channel layer CHL, and the source line may be connected to the lower portion of the channel layer CHL. Polarization may occur in the data storage layer DL by voltages applied to the bit line and the source line and a voltage applied to the gate line GL. Data may be stored in the data storage layer DL by the polarization.

Referring to an enlarged view of an area 31 including the data storage layer DL, the data storage layer DL may include a plurality of ferroelectric layers FL and an interface layer ITL. The ferroelectric layers FL may abut on the interlayer insulating layers ISL, the gate lines GL, and the channel layer CHL. The interface layer ITL may be formed between the ferroelectric layers FL. Since the gate lines GL and the channel layer CHL are formed of conductive layers or metal layers, dopants D included in the gate lines GL or the channel layer CHL may migrate to the data storage layer DL during a process of forming the channel layer CHL or a process that is performed after the channel layer CHL has been formed. For example, in case that the data storage layer DL is formed of only the ferroelectric layers FL, the dopants D may diffuse into the entirety of the ferroelectric layers FL. In this case, the remanent polarization characteristics of the data storage layer DL may be degraded. If the remanent polarization characteristics of the data storage layer DL are degraded, a retention characteristic which is one of the characteristics of the non-volatile memory may be reduced. Hence, in the present embodiment, the interface layers ITL may be formed between the ferroelectric layers FL, so that the dopants D may be prevented from diffusing into the entirety of the data storage layer DL.

For example, the interface layer ITL may be formed in the data storage layer DL in an area closer to the channel layer CHL than to the gate line GL. In this case, a trap layer in which dopants D are trapped may be formed in the ferroelectric layer FL formed in a first area R1 between the interface layer ITL and the channel layer CHL. In other words, the trap layer may be a ferroelectric layer FL including the dopants D. The trap layer formed in the first area R1 may be a layer including the dopants D trapped in the ferroelectric layer FL, and function to maintain the polarization of the data storage layer DL. Therefore, the entirety of the ferroelectric layer FL, which is formed between the interface layer ITL and the channel layer CHL, and in which the dopants D are trapped, may become the trap layer, or a portion of the ferroelectric layer FL formed between the interface layer ITL and the channel layer CHL may become the trap layer. If the dopants D are diffused into the entirety of the data storage layer DL, the retention characteristic of the data storage layer DL may be degraded. However, in case that as illustrated in the present embodiment the dopants D are formed in only a perimeter of the data storage layer DL to form the trap layer, the retention characteristic of the data storage layer DL may be improved because the trap layer can function to block an external electric field or the like.

The ferroelectric memory including the ferroelectric layers FL and the interface layer ITL may have various structures. The ferroelectric memory having various structures will be described with reference to FIGS. 4A to 4E.

FIGS. 4A to 4E are diagrams for describing various structures of the ferroelectric memory.

Figure 4A:
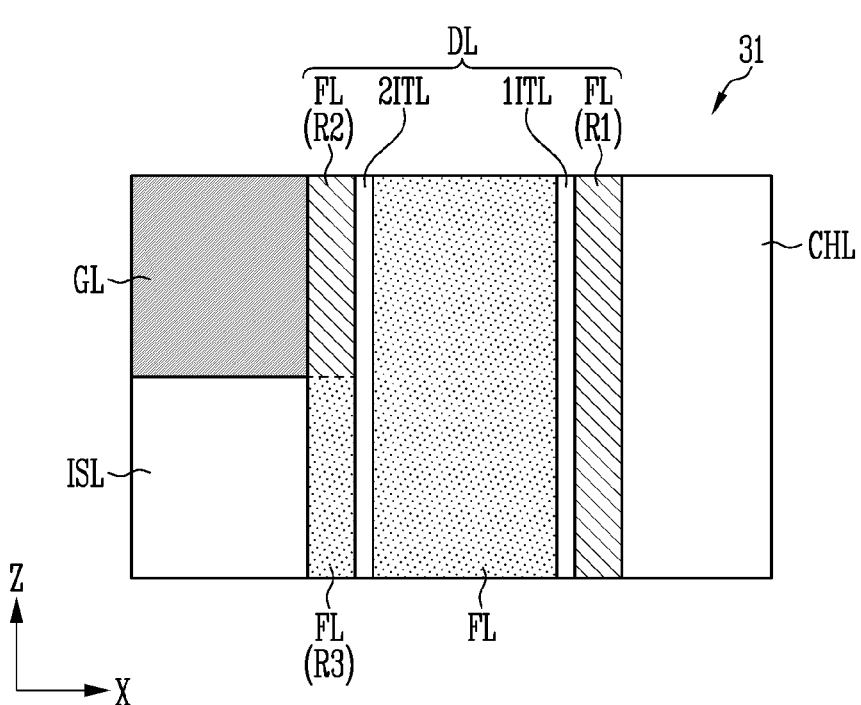

Referring to FIG. 4A, interface layers 1ITL and 2ITL may be formed in areas that are respectively adjacent to the channel layer CHL and the gate line GL. For example, a first interface layer 1ITL may be formed in the area adjacent to the channel layer CHL. A second interface layer 2ITL may be formed in the area adjacent to the gate line GL. Dopants D diffused from the channel layer CHL may be trapped in the ferroelectric layer FL formed in the first area R1 between the first interface layer 1ITL and the channel layer CHL. Dopants D diffused from the gate line GL may be trapped in the ferroelectric layer FL formed in the second area R2 between the second interface layer 2ITL and the gate line GL. Therefore, the ferroelectric layers FL formed in the first and second areas R1 and R2 may become trap layers in which the dopants D are trapped. For instance, the ferroelectric layer FL formed between the first interface layer 1ITL and the channel layer CHL may become a trap layer. For instance, the ferroelectric layer FL formed between the second interface layer 2ITL and the gate lines GL may become a trap layer. Dopants D may not be diffused into the ferroelectric layer FL formed between the second interface layer 2ITL and the interlayer insulating layers ISL, or even if the dopants are diffused thereinto, only a small amount of dopants may be diffused thereinto. Therefore, the ferroelectric layer FL formed between the second interface layer 2ITL and the interlayer insulating layers ISL may be maintained as a ferroelectric layer.

In other words, the ferroelectric layer FL may be formed between the first and second interface layers 1ITL and 2ITL. That is, the data storage layer DL may include the ferroelectric layers FL and the first and second interface layers 1ITL and 2ITL that are formed between the gate lines GL and the channel layer CHL. The ferroelectric layer FL formed between the interlayer insulating layers ISL and the second interface layer 2ITL may be a third area R3 because the dopants D are not diffused thereinto. In other words, although the ferroelectric layers FL that are respectively formed in the second area R2 and the third area R3 are the same layer, the ferroelectric layer FL in the second area R2 may be used as a trap layer including dopants, and the ferroelectric layer FL in the third area R3 may be used as a layer including no dopant.

Figure 4B:
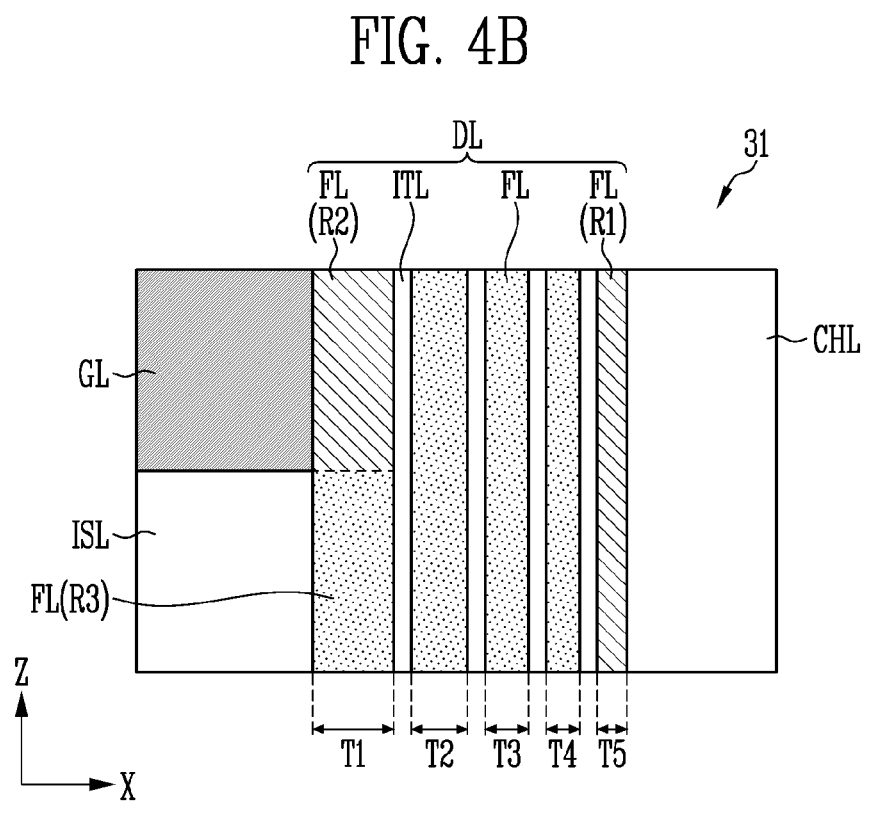

Referring to FIG. 4B, the data storage layer DL may include a plurality of ferroelectric layers FL and a plurality of interface layers ITL. The thicknesses of the interface layers ITL may be the same as each other. The thicknesses of the ferroelectric layers FL may differ from each other. For example, the ferroelectric layers FL may be formed such that the thicknesses thereof are reduced in a direction away from the gate lines GL, or in a direction toward the channel layer CHL. For example, the ferroelectric layer FL that abuts on the gate lines GL and the interlayer insulating layers ISL may have a first thickness T1 that is largest, and the subsequent ferroelectric layer FL may have a second thickness T2 that is less than the first thickness T1. In this way, the ferroelectric layer FL that abuts on the channel layer CHL may have a fifth thickness T5 that is smallest. The foregoing structure may be applied to a memory device in which the amount of reduction in retention of the data storage layer DL due to the gate lines GL is greater than that due to the channel layer CHL. For example, as the thickness of the second area R2 adjacent to the gate lines GL is increased, the thickness of a trap layer in which dopants are trapped is also increased. Hence, a retention reduction attributable to an external electrical factor such as leakage current which may occur in a direction from the gate lines GL may be mitigated.

Figure 4C:
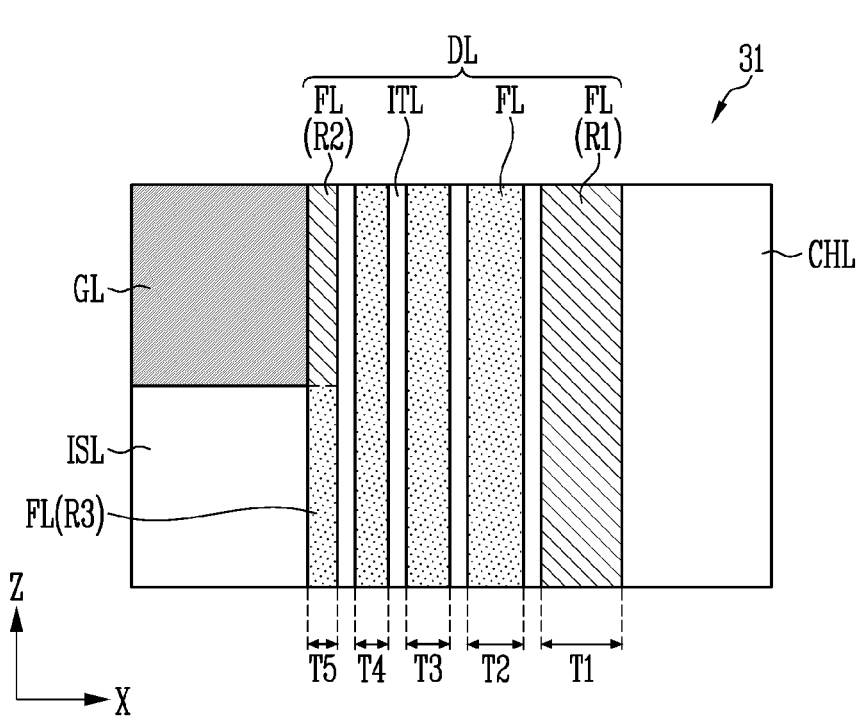

Referring to FIG. 4C, the data storage layer DL may include a plurality of ferroelectric layers FL and a plurality of interface layers ITL. The thicknesses of the interface layers ITL may be the same as each other. The thicknesses of the ferroelectric layers FL may differ from each other. For example, the ferroelectric layers FL may be formed such that the thicknesses thereof are reduced in a direction from the channel layer CHL toward the gate lines GL. For example, the ferroelectric layer FL that abuts on the channel layer CHL may have a first thickness T1 that is largest, and the subsequent ferroelectric layer FL may have a second thickness T2 that is less than the first thickness T1. In this way, the ferroelectric layer FL that abuts on the gate lines GL and the interlayer insulating layers ISL may have a fifth thickness T5 that is smallest. The foregoing structure may be applied to a memory device in which the amount of reduction in retention of the data storage layer DL due to the channel layer CHL is greater than that due to the gate lines GL. For example, as the thickness of the first area R1 adjacent to the channel layer CHL is increased, the thickness of a trap layer in which dopants are trapped is also increased. Hence, a retention reduction attributable to an external electrical factor such as leakage current which may occur in a direction from the channel layer CHL may be mitigated.

Figure 4D:
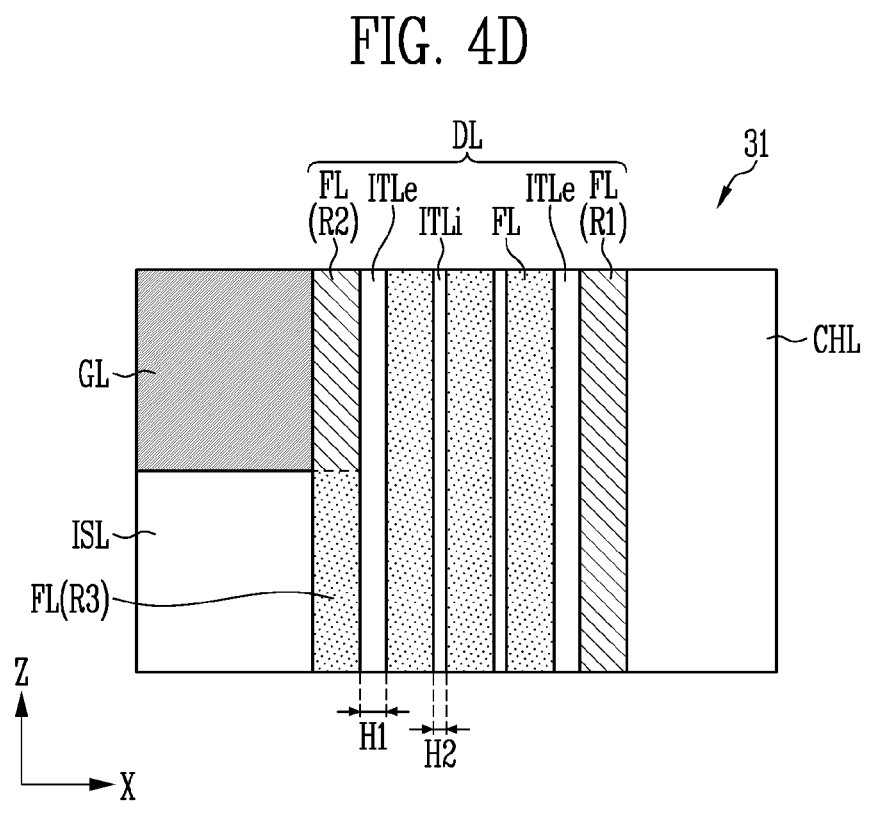

Referring to FIG. 4D, interface layers ITLe adjacent to the interlayer insulating layers ISL and the gate lines GL and adjacent to the channel layer CHL may be different in thickness from interface layers ITLi formed in an area distant from the interlayer insulating layers ISL and the gate lines GL and distant from the channel layer CHL. For example, the interface layers adjacent to the interlayer insulating layers ISL and the gate lines GL and adjacent to the channel layer CHL may be defined as "external interface layers ITLe". The interface layers formed between the external interface layers ITLe may be defined as "internal interface layers ITLi". In the foregoing structure, to more effectively block the dopants diffusing from the gate lines GL or the channel layer CHL, the thickness of each of the external interface layers ITLe may be greater than that of each of the internal interface layers ITLi. For example, the external interface layers ITLe each may have a first thickness H1. The internal interface layers ITLi each may have a second thickness H2 less than the first thickness H1.

Figure 4E:
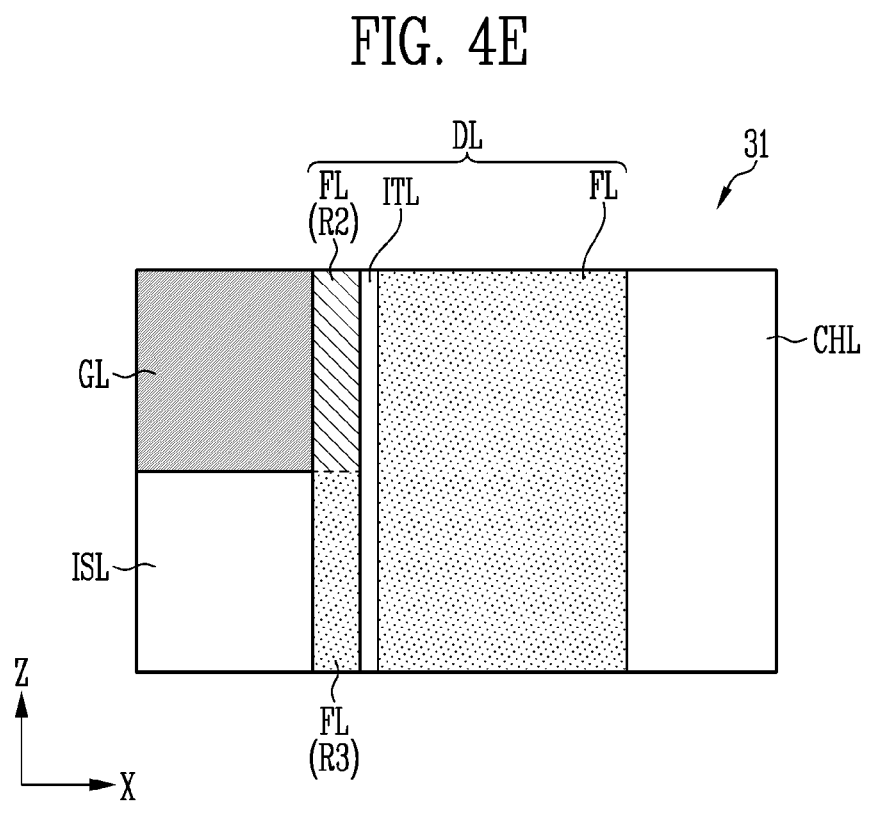

Referring to FIG. 4E, an interface layer ITL may be formed in an area adjacent to the gate lines GL, and the interface layer ITL might not be formed in an area adjacent to the channel layer CHL. Ferroelectric layers FL may be formed between the interface layer ITL and the channel layer CHL, between the interface layer ITL and the gate lines GL, and between the interface layer ITL and the interlayer insulating layers ISL. The ferroelectric layer FL formed between the interface layer ITL and the gate lines GL may be the same layer as the ferroelectric layer FL formed between the interface layer ITL and the interlayer insulating layers ISL.

Since dopants D diffused from the gate lines GL may be trapped in the second area R2 between the gate lines GL and the interface layer ITL, the ferroelectric layer FL formed in the second area R2 may form a trap layer. Since the dopants are not diffused from the interlayer insulating layer ISL, the dopants might not be trapped in the ferroelectric layer FL formed in a third area R3 between the interlayer insulating layer ISL and the interface layer ITL. Although in embodiments illustrated in FIGS. 4A to 4E there are shown various thicknesses and intervals of the ferroelectric layers FL and the interface layers ITL included in the data storage layer DL, the ferroelectric layers FL and the interface layers ITL may have various thicknesses and intervals as well as those of the embodiments illustrated in FIGS. 4A to 4E, depending on electrical characteristics of the ferroelectric memory device.

FIGS. 5A to 5F are diagrams for describing a method of fabricating the ferroelectric memory device in accordance with an embodiment of the present disclosure.

Although FIGS. 5A to 5F are diagrams for describing a method of fabricating the ferroelectric memory device described with reference to FIG. 3, the fabricating method described with reference to FIGS. 5A to 5F may also be applied to the ferroelectric memory device described with reference to FIGS. 4A to 4E.

Figure 5A:
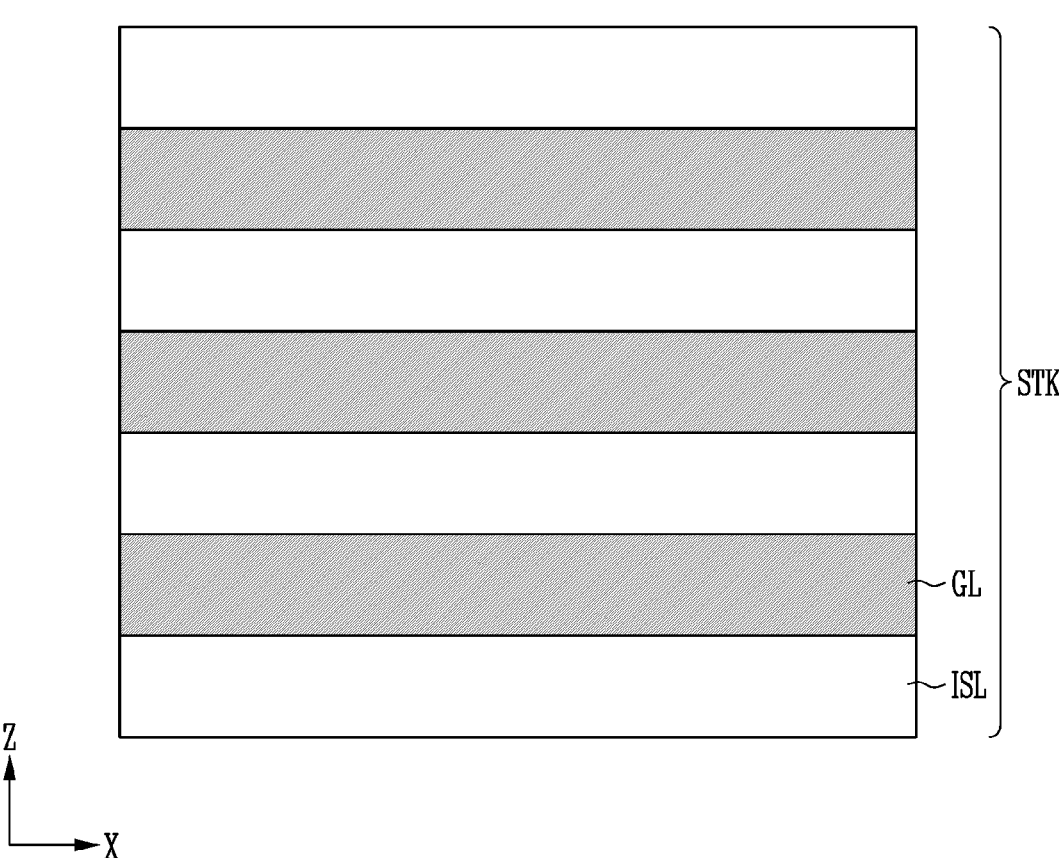
FIGS. 5A to 5F are diagrams for describing a method of fabricating the ferroelectric memory device in accordance with an embodiment of the present disclosure.

Referring to FIG. 5A, a stack structure STK in which interlayer insulating layers ISL and gate lines GL are alternately stacked may be provided. Although not illustrated in the drawings, the stack structure STK may be formed on a substrate or a peripheral circuit structure including the substrate. The interlayer insulating layers ISL may be configured to block electrical connections between the gate lines GL, and may be formed of oxide layers or silicon oxide layers. The gate lines GL may be formed of conductive layers or metal layers. For example, the gate lines GL each may be formed of any one of tungsten (W), cobalt (Co), nickel (Ni), molybdenum (Mo), silicon (Si), and poly-silicon (poly-Si), or formed of a compound thereof.

Figure 5B:
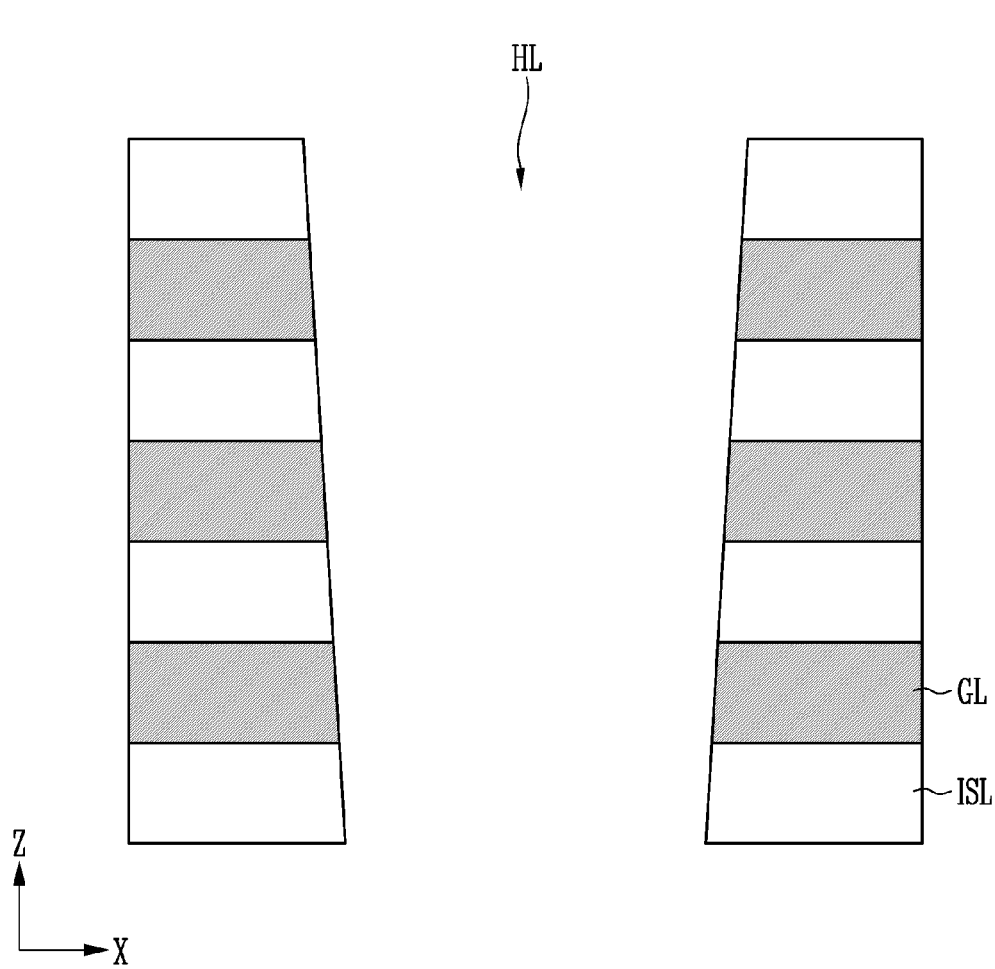

Referring to FIG. 5B, an etching process may be performed to form a vertical hole HL that vertically passes through the interlayer insulating layers ISL and the gate lines GL. The etching process may be a dry etching process. For example, the etching process may be an anisotropic dry etching process. If the vertical hole HL is formed, portions of the interlayer insulating layers ISL and the gate lines GL may be exposed through a side surface of the vertical hole HL.

Figure 5C:
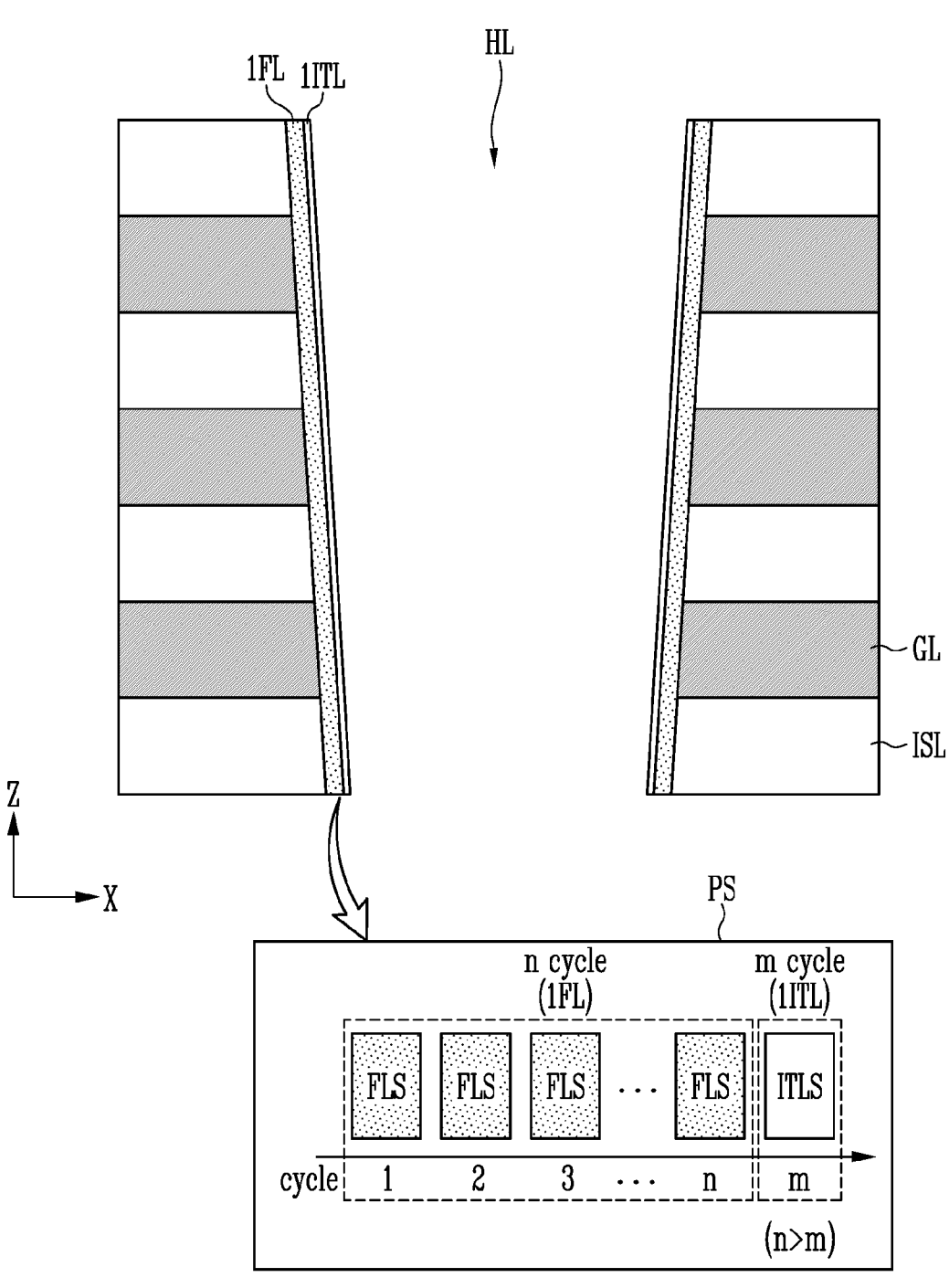

Referring to FIG. 5C, a deposition process may be performed to form a first ferroelectric layer 1FL and a first interface layer 1ITL for a data storage layer on the interlayer insulating layers ISL and the gate lines GL that are exposed through the side surface of the vertical hole HL. For example, after the first ferroelectric layer 1FL is formed in a cylindrical shape along an inner wall of the vertical hole HL, the first interface layer 1ITL may be formed in a cylindrical shape along an inner wall of the first ferroelectric layer 1FL. The deposition process PS of forming the first ferroelectric layer 1FL and the first interface layer 1ITL may be performed in an in-situ scheme in which source gas is changed in an identical chamber, and may also be performed in an ex-situ scheme in which chambers are changed depending on source gas.

The deposition process PS of forming the first ferroelectric layer 1FL and the first interface layer 1ITL may be performed in an atomic layer deposition (ALD) scheme or an area selective deposition (ASD) scheme. For example, in the ALD or ASD scheme, a cycle of injecting ferroelectric layer source gas FLS may be performed n times (n is a positive integer), and a cycle of injecting interface layer source gas ITLS may be performed m times (m is a positive integer). To form the first ferroelectric layer 1FL to be thicker than the first interface layer 1ITL, m may be set to a positive integer less than n. In other words, the thickness of the first ferroelectric layer 1FL may be determined depending on the number of times n of cycles. The thickness of the first interface layer 1ITL may be determined depending on the number of times m of cycles. For example, as n is increased, the thickness of the first ferroelectric layer 1FL may be increased. As m is increased, the thickness of the first interface layer 1ITL may be increased. On the other hand, as n is reduced, the thickness of the first ferroelectric layer 1FL may be reduced. As m is reduced, the thickness of the first interface layer 1ITL may be reduced.

Figure 5D:
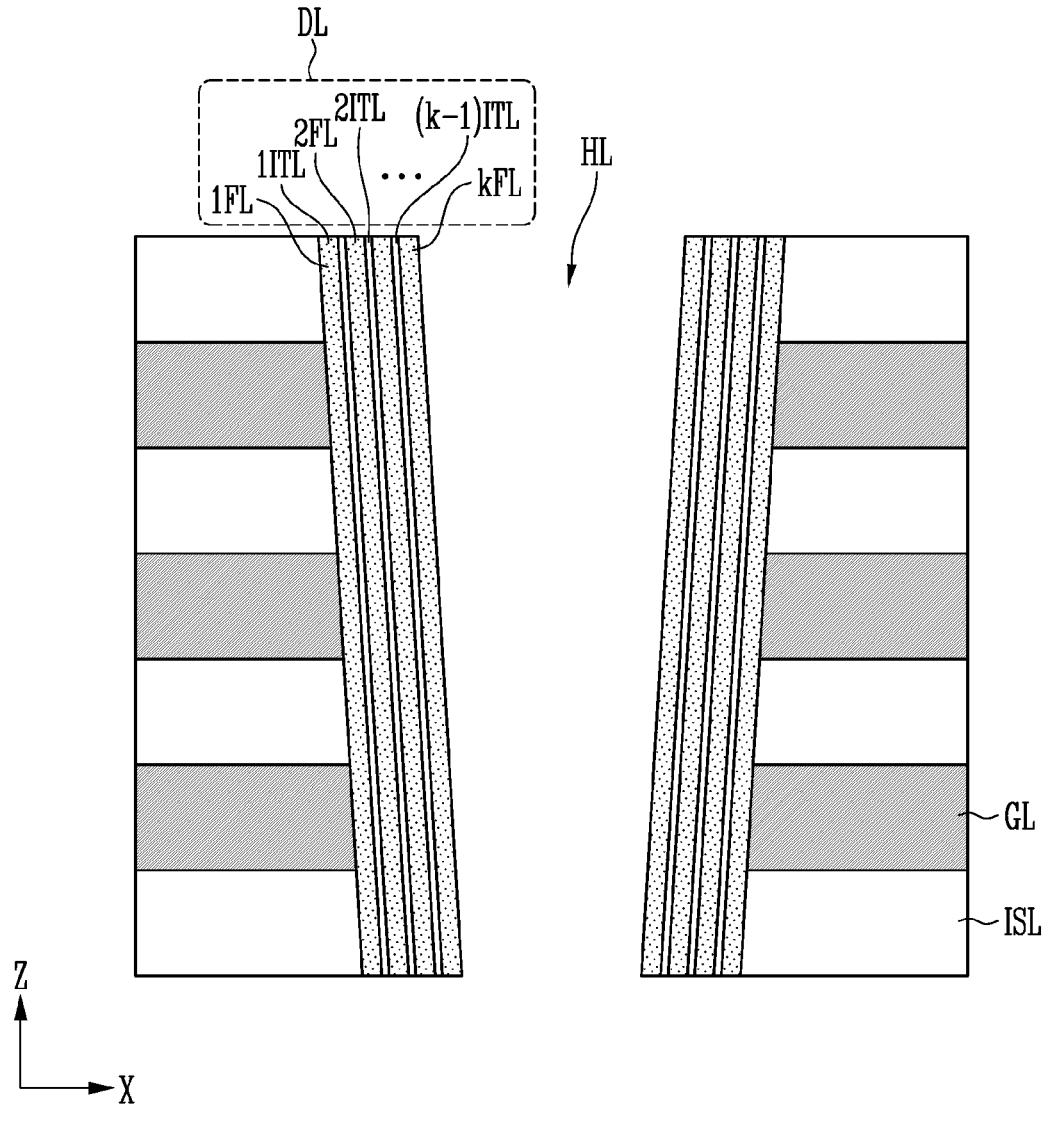

Referring to FIG. 5D, a data storage layer DL may be formed by performing a plurality of times the deposition process PS described with reference to FIG. 5C. For example, the deposition process may be performed k times (k is a positive integer), and the step of forming an interface layer may be omitted during the last deposition process. For example, when the deposition process is performed k times, first to k-th ferroelectric layers 1FL to kFL and first to (k−1)-th interface layers 1ITL to (k−1)ITL may be formed. For instance, the first ferroelectric layer 1FL may be formed along sidewalls of the interlayer insulating layers ISL and the gate lines GL. The first interface layer 1ITL may be formed along an inner sidewall of the first ferroelectric layer 1FL. The second ferroelectric layer 2FL may be formed along an inner sidewall of the first interface layer 1ITL. The second interface layer 2ITL may be formed along an inner sidewall of the second ferroelectric layer 2FL. In this way, the (k−1)-th interface layer (k−1)ITL may be formed, and the k-th ferroelectric layer kFL may be formed along an inner sidewall of the (k−1)-th interface layer (k−1)ITL. The deposition process PS for forming the data storage layer DL may be terminated after the k-th ferroelectric layer kFL is formed.

Figure 5E:
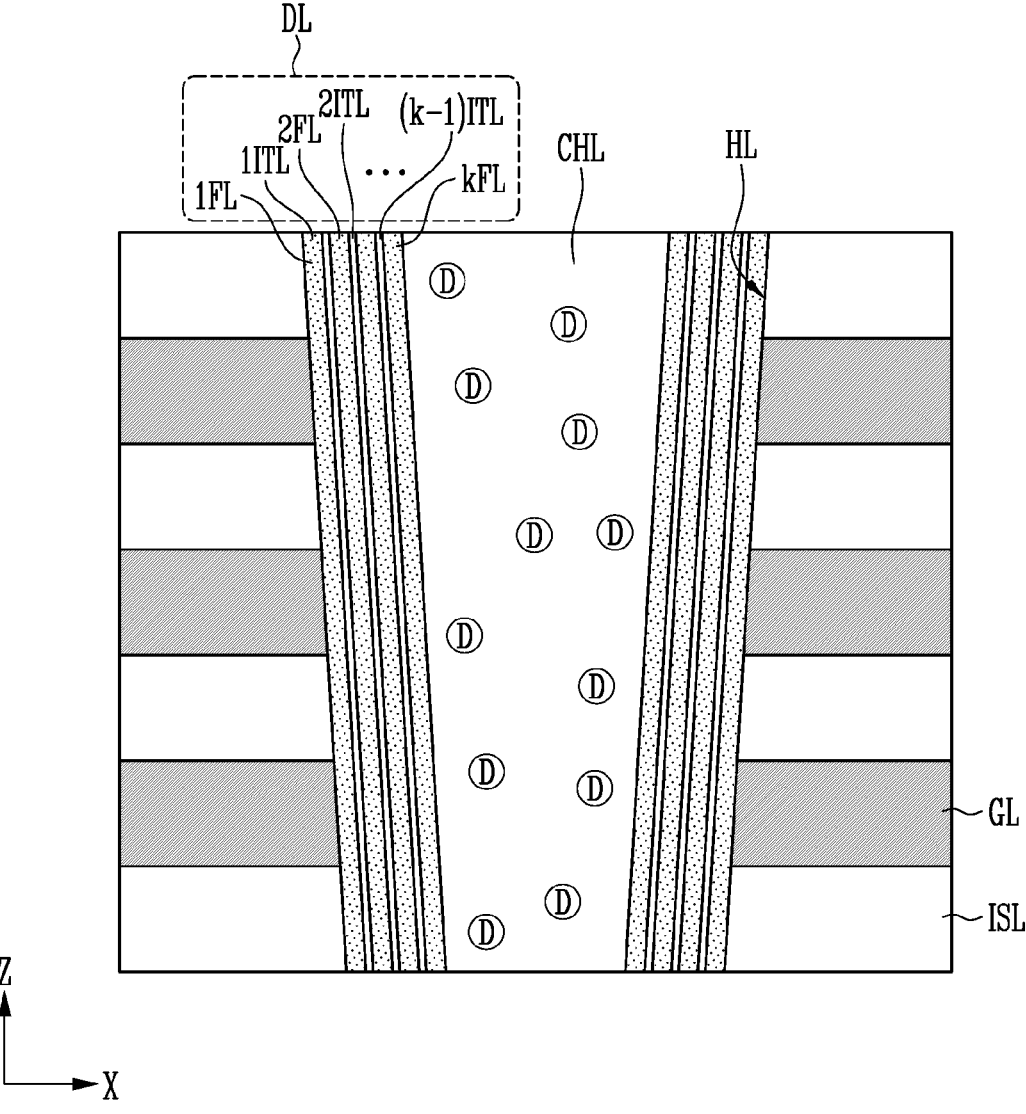

Referring to FIG. 5E, a process of forming a channel layer CHL in the vertical hole HL in which the data storage layer DL is formed may be performed. The channel layer CHL may be formed of a conductive layer or a metal layer. For instance, the channel layer CHL may be formed of silicon or polysilicon. Although dopants D are included in the channel layer CHL because the channel layer CHL is formed of conductive material, additional dopant source gas may be injected into the chamber during the process of forming the channel layer CHL so as to more easily form the trap layer in a boundary on which the data storage layer DL and the channel layer CHL abut on each other. In other words, to increase the concentration of the dopants in the channel layer CHL at the step of forming the channel layer CHL, additional dopant source gas may be injected into the chamber in which the channel layer CHL is to be formed. The dopants D may include any one dopant D of boron (B), phosphorus (P), and arsenic (As). In addition, various dopants which can be used in a semiconductor may be used as the dopants D. Therefore, the dopant source gas may also be selected from among boron (B), phosphorus (P), and arsenic (As) gas. Additional various dopant source gases may be used.

Figure 5F:
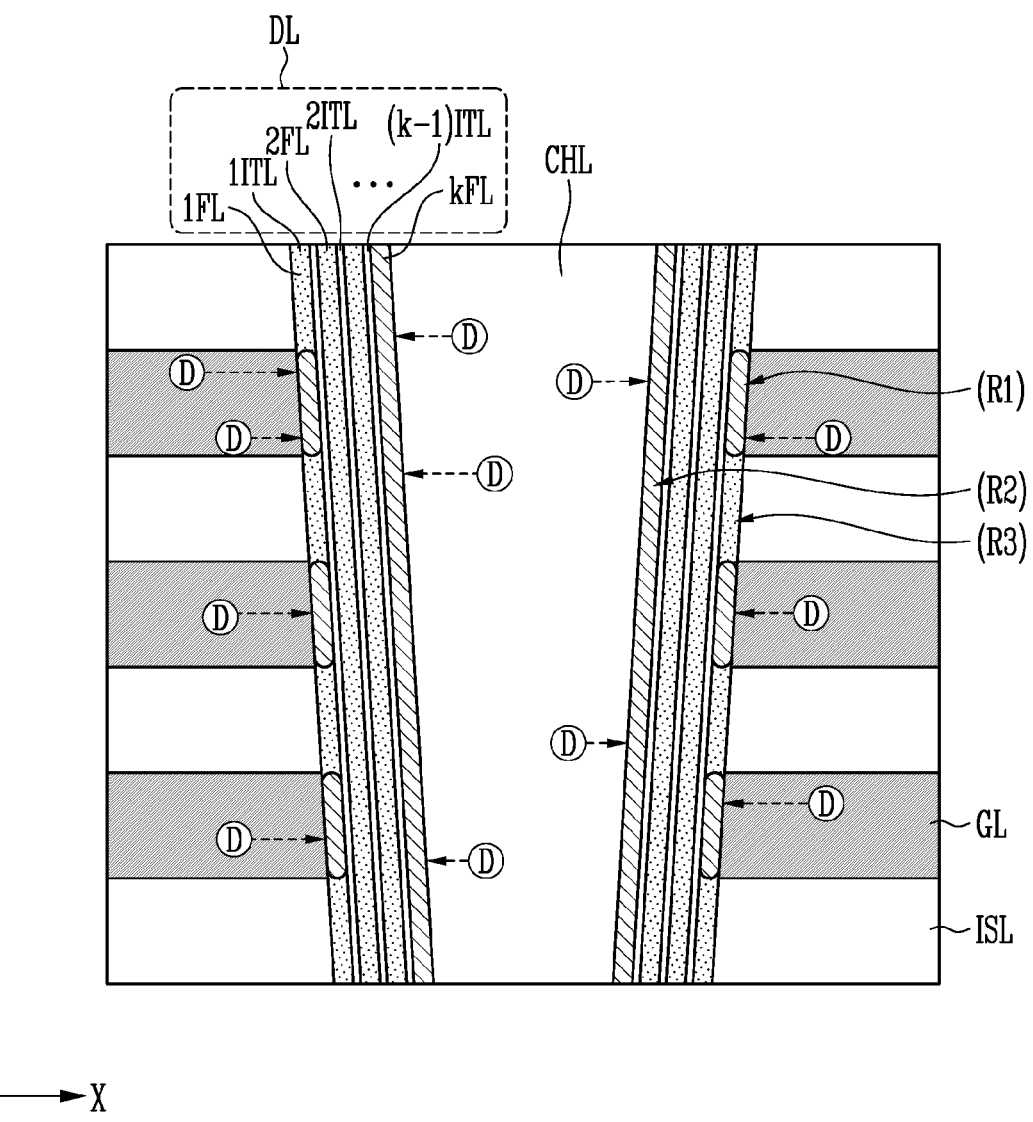

Referring to FIG. 5F, when the process of forming the channel layer CHL or the processes subsequent to the process of forming the channel layer CHL is performed, dopants D included in the channel layer CHL and the gate lines GL may migrate to other areas, or dopants D included in the channel layer CHL or the gate lines GL may migrate to other areas. Here, dopants D may be diffused to the first ferroelectric layer 1FL that abuts on the gate lines GL and the k-th ferroelectric layer kFL that abuts on the channel layer CHL, or dopants D may be diffused to the first ferroelectric layer 1FL that abuts on the gate lines GL or the k-th ferroelectric layer kFL that abuts on the channel layer CHL, so that trap layers in which the dopants D are trapped in the ferroelectric layers may be formed. For example, the dopants D diffused to the first ferroelectric layer 1FL might not permeate the second ferroelectric layer 2FL by the first interface layer 1ITL. The dopants D diffused to the k-th ferroelectric layer kFL might not permeate the (k−1)-th ferroelectric layer (k−1) FL by the (k−1)-th interface layer (k−1)ITL. Therefore, a portion of the first ferroelectric layer 1FL disposed in an outer circumference of the data storage layer DL, and the k-th ferroelectric layer kFL disposed in an inner circumference of the data storage layer DL each may form a trap layer. Even if some dopants pass through the first interface layer 1ITL or the (k−1)-th interface layer (k−1)ITL and permeate a subsequent ferroelectric layer, further diffusion of the dopants may be blocked by subsequent interface layers. Therefore, the dopants may be prevented from permeating deep into the data storage layer DL.

Detailed description of the structure of the first ferroelectric layer 1FL is as follows: in the first ferroelectric layer 1FL disposed in the outer circumference of the data storage layer DL, portions that abut on the gate lines GL each may form a trap layer, and portions that abut on the interlayer insulating layers ISL each may be maintained as the ferroelectric layer. The trap layer formed by diffusion of dopants from the gate lines GL or the channel layer CHL may have polarization characteristics of the ferroelectric layer, and prevent the remanent polarization characteristics of the second to (k−1)-th ferroelectric layers 2FL to (k−1)FL from being degraded.

Figure 6:
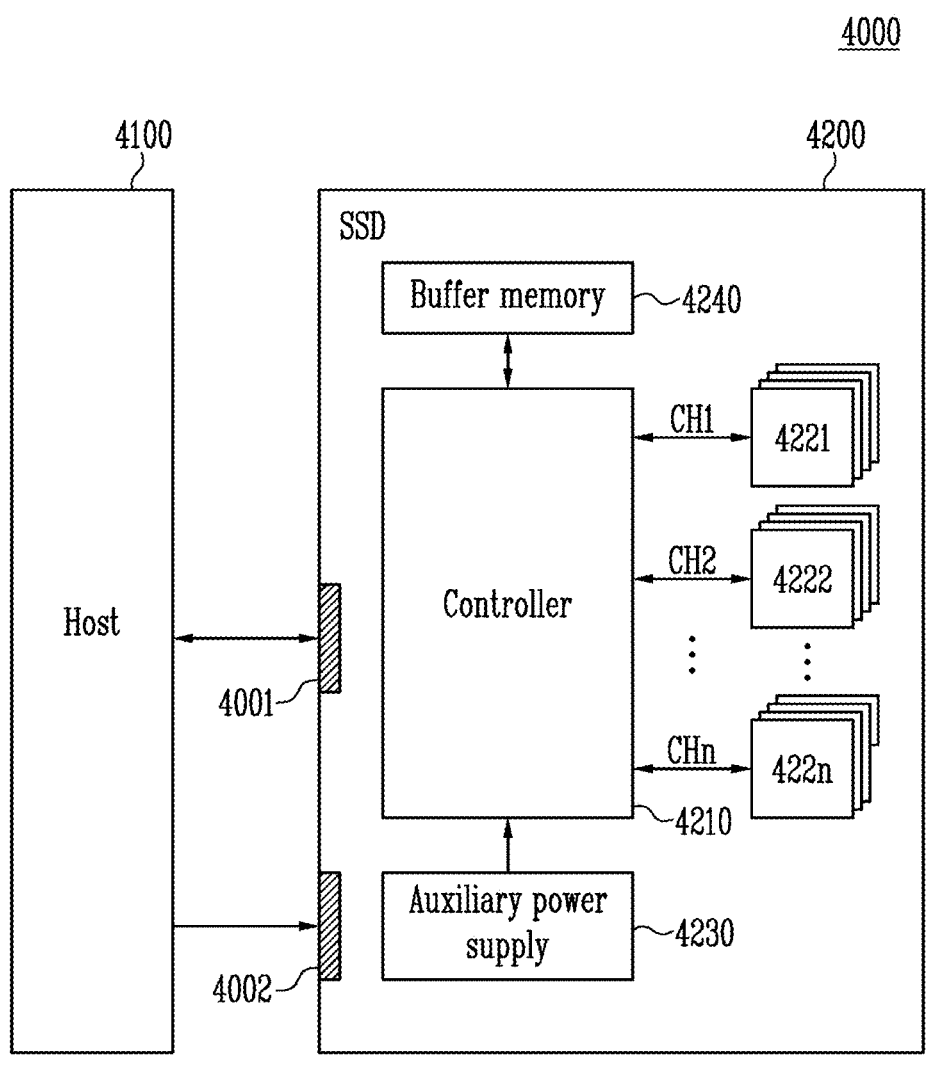
FIG. 6 is a diagram illustrating a solid state drive (SSD) system to which the ferroelectric memory device in accordance with an embodiment of the present disclosure is applied.

FIG. 6 is a block diagram illustrating a solid state drive (SSD) system 4000 to which the ferroelectric memory device in accordance with an embodiment of the present disclosure is applied.

Referring to FIG. 6, the SSD system 4000 may include a host 4100 and an SSD 4200. The SSD 4200 may transceiver a signal with the host 4100 through a signal connector 4001, and be supplied with power through the power connector 4002. The SSD 4200 may include a controller 4210, a plurality of ferroelectric memory devices 4221 to 422n, an auxiliary power supply 4230, and a buffer memory 4240.

In accordance with an embodiment, the plurality of ferroelectric memory devices 4221 to 422n each may have the same configuration as that of the ferroelectric memory device 1100 described with reference to FIG. 1.

The controller 4210 may control the plurality of ferroelectric memory devices 4221 to 422n in response to a signal received from the host 4100. For example, the signal may include signals based on an interface between the host 4100 and the SSD 4200. For example, the signal may be a signal defined by at least one of various interfaces such as universal serial bus (USB), a multimedia card (MMC), an embedded MMC (eMMC), peripheral component interconnection (PCI), PCI-express (PCI-E), advanced technology attachment (ATA), serial-ATA (SATA), parallel-ATA (PATA), a small computer system interface (SCSI), an enhanced small disk interface (ESDI), integrated drive electronics (IDE), firewire, universal flash storage (UFS), Wi-Fi, Bluetooth, and nonvolatile memory express (NVMe) interfaces.

The auxiliary power supply 4230 may be connected with the host 4100 through the power connector 4002. The auxiliary power supply 4230 may be supplied with a power voltage from the host 4100 and charged by the power voltage. The auxiliary power supply 4230 may supply the power voltage to the SSD 4200 when the supply of power from the host 4100 is not smoothly performed. In an embodiment, the auxiliary power supply 4230 may be positioned inside the SSD 4200 or positioned outside the SSD 4200. For example, the auxiliary power supply 4230 may be disposed in a main board and may supply auxiliary power to the SSD 4200.

The buffer memory 4240 may be used as a buffer memory of the SSD 4200. For example, the buffer memory 4240 may temporarily store data received from the host 4100 or data received from the plurality of ferroelectric memory devices 4221 to 422n or may temporarily store metadata (e.g., a mapping table) of the ferroelectric memory devices 4221 to 422n. The buffer memory 4240 may include volatile memory such as DRAM, SDRAM, DDR SDRAM, and LPDDR SDRAM, or nonvolatile memory such as FRAM, ReRAM, STT-MRAM, and PRAM.

Figure 7:
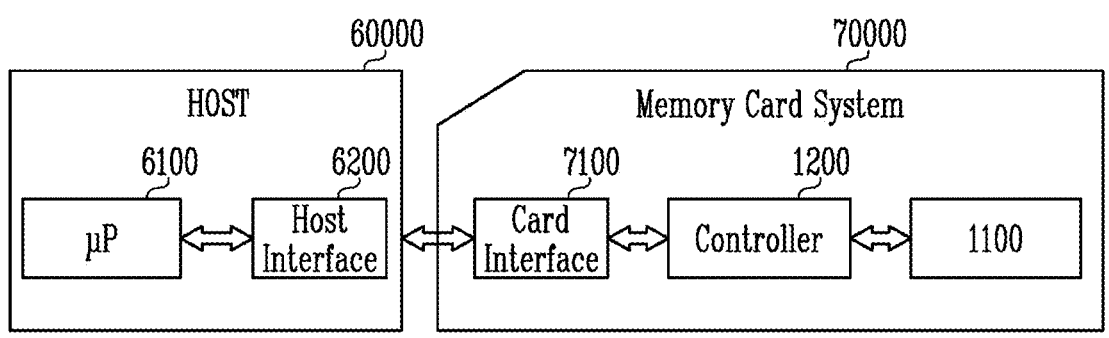
FIG. 7 is a diagram illustrating a memory card system to which the ferroelectric memory device in accordance with an embodiment of the present disclosure is applied.

FIG. 7 is a block diagram illustrating a memory card system 70000 to which the ferroelectric memory device in accordance with an embodiment of the present disclosure is applied.

Referring to FIG. 7, the memory card system 70000 may be embodied in a memory card or a smart card. The memory card system 70000 may include a ferroelectric memory device 1100, a controller 1200, and a card interface 7100.

The ferroelectric memory device 1100 may have the same configuration as that of the ferroelectric memory device 1100 illustrated in FIG. 1.

The controller 1200 may control data exchange between the ferroelectric memory device 1100 and the card interface 7100. In an embodiment, the card interface 7100 may be a secure digital (SD) card interface or a multi-media card (MMC) interface, but the present disclosure is not limited thereto.

The card interface 7100 may interface data exchanged between the host 60000 and the controller 1200 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory card system 70000 is connected to a host interface 6200 of the host 60000 such as a PC, a tablet PC, a digital camera, a digital audio player, a cellular phone, console video game hardware or a digital set-top box, the host interface 6200 may perform data communication with the ferroelectric memory device 1100 through the card interface 7100 and the controller 1200 under control of a microprocessor (μP) 6100.

In accordance with an embodiment, retention characteristics of a ferroelectric memory device may be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and detail may be made without departing from the spirit and scope of the present disclosure as set forth in the following claims.

What is claimed is:

1. A ferroelectric memory device comprising:
interlayer insulating layers and gate lines alternately stacked;
a data storage layer vertically passing through the interlayer insulating layers and the gate lines and having a cylindrical shape; and
a channel layer formed in an area enclosed by the data storage layer,
wherein the data storage layer comprises:
a first ferroelectric layer abutting on the channel layer;
a second ferroelectric layer abutting on the interlayer insulating layers and the gate lines;
a third ferroelectric layer formed between the first ferroelectric layer and the second ferroelectric layer;
a first interface layer formed between the first ferroelectric layer and the third ferroelectric layer;
a second interface layer formed between and the second ferroelectric layer and the third ferroelectric layer,
wherein a thickness of the third ferroelectric layer is greater than a thickness of each of the first and second ferroelectric layers.

2. The ferroelectric memory device according to claim 1, wherein:
the first interface layer is formed in an area closer to the channel layer than to the gate lines; and
the first ferroelectric layer contains dopants diffused from the channel layer.

3. The ferroelectric memory device according to claim 1, wherein:
the second interface layer is formed in an area closer to the gate lines than to the channel layer; and
the second ferroelectric layer contains dopants diffused from the gate lines.

4. The ferroelectric memory device according to claim 1, wherein the first and the second ferroelectric layers comprise at least one of $PbZrTiO_3$, $SrBi_2Ta_2O_9$, $BiFeO_3$, $HfO_2$, $HfO_2ZrO_2$, and $HfSiO_4$.

5. The ferroelectric memory device according to claim 1, wherein each of the first and second interface layers comprises $SiO_2$.

6. The ferroelectric memory device according to claim 1, wherein the first and second interlayer insulating layers comprise oxide layers or silicon oxide layers.

7. The ferroelectric memory device according to claim 1, wherein the gate lines comprise at least one of tungsten, cobalt, nickel, molybdenum, silicon, and poly-silicon.

8. The ferroelectric memory device according to claim 1, wherein the channel layer comprises silicon or poly-silicon.

9. A ferroelectric memory device comprising:

interlayer insulating layers and gate lines alternately stacked;

a data storage layer vertically passing through the interlayer insulating layers and the gate lines and having a cylindrical shape; and a channel layer formed in an area enclosed by the data storage layer, wherein the data storage layer comprises:

a first ferroelectric layer abutting on the channel layer;

a second ferroelectric layer abutting on the interlayer insulating layers and the gate lines;

a third ferroelectric layer formed between the first and the second ferroelectric layers;

a first interface layer formed between the first and the third ferroelectric layers; and a second interface layer formed between the second and the third ferroelectric layers, wherein the third ferroelectric layer has a different thickness from each of the first ferroelectric layer and the second ferroelectric layer.

10. The ferroelectric memory device according to claim 9, wherein a thickness of each of the first to the third ferroelectric layers is greater than a thickness of each of the first and the second interface layers.

11. The ferroelectric memory device according to claim 9, wherein thicknesses of the first and the second ferroelectric layers are identical with each other.

12. The ferroelectric memory device according to claim 9, wherein the first ferroelectric layer has a first thickness, wherein the third ferroelectric layer has a third thickness less than the first thickness, and wherein the second ferroelectric layer has a second thickness less than the third thickness.

13. The ferroelectric memory device according to claim 9, wherein the second ferroelectric layer has a second thickness, wherein the third ferroelectric layer has a third thickness less than the second thickness, and wherein the first ferroelectric layer has a first thickness less than the third thickness.

14. The ferroelectric memory device according to claim 9, wherein the first and the second interface layers have the same thickness.

15. The ferroelectric memory device according to claim 9, further comprising a plurality of ferroelectric layers and a plurality of interface layers formed between the first and the second interface layers.

16. The ferroelectric memory device according to claim 9, wherein the first ferroelectric layer comprises dopants diffused from the channel layer.

17. The ferroelectric memory device according to claim 9, wherein the second ferroelectric layer comprises dopants diffused from the gate lines.

18. The ferroelectric memory device according to claim 15, wherein the first interface layer has a first thickness, wherein the second interface layer has a second thickness, wherein each of the plurality of interface layers has a third thickness less than each of the first thickness and the second thickness.

* * * * *